United States Patent [19]

Fossum et al.

[11] Patent Number: 4,776,925

[45] Date of Patent: Oct. 11, 1988

[54] METHOD OF FORMING DIELECTRIC THIN FILMS ON SILICON BY LOW ENERGY ION BEAM BOMBARDMENT

[75] Inventors: Eric R. Fossum, Yorktown Heights; Stanley S. Todorov, New York, both of N.Y.

[73] Assignee: The Trustees of Columbia University in the City of New York, New York, N.Y.

[21] Appl. No.: 44,829

[22] Filed: Apr. 30, 1987

[51] Int. Cl.$^4$ .................... H01L 21/00; C23C 14/00; B05D 3/06; B44C 1/22

[52] U.S. Cl. .................................. 156/653; 156/643; 156/657; 204/192.11; 427/38; 437/34; 437/239; 437/242

[58] Field of Search ............... 156/643, 653, 657, 662; 204/192.11, 192.23, 192.31, 192.37; 437/29, 34, 40, 41, 42, 228, 238, 241, 239, 242; 427/38, 39

[56] References Cited

U.S. PATENT DOCUMENTS

| | | | |
|---|---|---|---|
| 3,563,809 | 2/1971 | Wilson | 148/1.5 |
| 3,647,535 | 3/1972 | Naber | 117/212 |
| 3,916,034 | 10/1975 | Tsuchimoto | 427/38 |
| 4,323,589 | 4/1982 | Ray et al. | 427/38 |
| 4,351,712 | 9/1982 | Cuomo et al. | 204/192 |
| 4,443,488 | 4/1984 | Little et al. | 427/38 |
| 4,518,630 | 5/1985 | Grasser | 427/93 |
| 4,673,475 | 6/1987 | Windischmann | 204/192.11 |

OTHER PUBLICATIONS

Streb et al., "Surface Silicon Oxynitride Films Obtained by Implanting Mixtures of Oxygen and Nitrogen Ions into Silicon," J. Vac. Sci. Technol. B 2(4), Oct.-Dec. 1984, pp. 626-629.
G. Kaus et al., "Method of Producing Very Thin Oxide Layers On Substrates", IDM TDM, vol. 21, No. 2, Jul. 1978, p. 654.
Cohen, "Thin Si Films Can Form at Room Temperature", Electronics, Nov. 3, 1981, pp. 83-84.
S-I Kimura et al., "Low-Temperature Fabrication of MOSFET's Utilizing a Microwave-Excited Plasma Oxidation Technique, IEEE Electron Device Letts, edl-7, Jan., 1986, pp. 38-40.
A. K. Ray et al., "Plasma Oxide FET Devices", J. Electrochem Soc., 1981, 128, 2424.
H-S Lee et al., "Device Quality MOS Gate Insulators: Sputter Deposition and Low Temperature Processing, IEEE Electron Device Letts, EDL-3, 1982, 310.
A. W. Kleinsasser et al., "High-Quality Submicron Nioblum Tunnel Junctions with Reactive-Ion-Beam Oxidation", Appl. Phys. Letts, 37, Nov. 1, 1980, pp. 841-843.
J. M. E. Harper et al., "Ion Beam Oxidation", J. Appl. Phys., 52, Jun. 21, 1981, pp. 4118-4121.
T. M. Mayer et al., "Reactive Sputtering of Copper and Silicon Near the Sputtering Threshold", J. Vac. Sci. Techol., A3, 1985, pp. 1779-1782.
H. Daimon et al., "Ion Oxidation of Si(111)", Japan J. Appl. Phys., 21, Oct. 23, 1982, pp. L718-720.
S. Berg et al., "Self-Limiting Etch Depths Using Simultaneous Sputter Etching/Deposition Technique", J. Vac. Sci. Technol., A2, Apr.-Jun., 1984, pp. 470-473.
P. J. Grunthaner et al., "The Localization and Crystallographic Dependence of Si Suboxide Species at the SiO$_2$/Si Interface, J. Appl. Phys., vol. 58, No. 1, 1987.

*Primary Examiner*—William A. Powell
*Attorney, Agent, or Firm*—Brumbaugh, Graves, Donohue & Raymond

[57] ABSTRACT

A low-energy oxygen and/or nitrogen ion beam with an energy level of about 60 eV is used to form an ultrathin layer of silicon adduct on unheated silicon substrates. The ion beam is created with a single-grid Kaufman-type source and the process is performed in a vacuum chamber evacuated to a base pressure of about $3 \times 10^{-7}$ torr with oxygen and/or nitrogen gases, with or without argon introduced into the chamber. FET-gate-quality oxides on the order of about 45 angstroms have been produced in the successful fabrication of n-channel MOSFET's.

19 Claims, 3 Drawing Sheets

METHOD OF FORMING DIELECTRIC THIN FILMS ON SILICON BY LOW ENERGY ION BEAM BOMBARDMENT

The invention described herein was made in the course of work under a grant or award from the Department of Defense.

BACKGROUND OF THE INVENTION

The present invention relates to direct formation of dielectric thin films on silicon by low energy ion beam bombardment at room temperature.

Silicon dioxide is used in silicon MOS technology due to its excellent dielectric properties for use both for insulation and field enhancement in finished devices and at various stages of the fabrication process. Oxides for such applications are typically grown on the surfaces of silicon wafers at temperatures exceeding 900 degrees C. However, the requirements for increased performance and decreased dimension of semiconductor devices have necessitated the development of low-temperature fabrication processes such as ion implantation, rapid thermal annealing, and laser photochemical direct-writing processes. Reduced-temperature oxidation in thin-film FET's on low melting point substrates is desirable since repeated heating and cooling of the substrate leads to thermal stresses, crystal defects, wafer warpage and oxidation-enhanced diffusion which hinder the performance of small-dimension devices. These become increasingly important with the trend towards smaller device dimensions and efforts to fabricate stacked 3-dimensional MOS structures.

Various techniques have been proposed for oxidation of silicon at reduced temperatures, including plasma oxidation and anodization, chemical vapor deposition (CVD), plasma-enhanced CVD, photo-activated CVD, reactive sputtering, evaporation or sputtering in an oxygen ambient, and other methods. However, most of these processes have been applied to steps requiring a thick oxide and few of these have successfully produced thin oxides suitable for gate dielectrics. Presently high-temperature thermal oxidation remains the most viable means of producing high-quality gate dielectrics.

Ion beam oxidation has been used for oxidation of Nb using 600 eV oxygen ions to fabricate Josephson tunnel junctions. Low energy oxygen ion beams (45-80 eV) have been used in ion-beam oxidation of Ni and Cr and in reactive near-threshold sputtering of copper and silicon. In conjunction with photoelectron spectroscopy, a focused ion beam has been used to study oxidation kinetics on silicon (111).

SUMMARY OF THE INVENTION

It is an object of the present invention to produce an oxide or nitride layer on silicon substrate using a low-energy ion beam, to thereby produce an adduct of silicon.

It is a further object of the present invention to produce an oxide or nitride layer on unheated silicon substrates at room temperature.

It is a further object of the present invention to produce an oxide or nitride layer having a uniform thickness on silicon substrates.

It is a further object of the present invention to produce thin gate-quality dielectrics of uniform thickness on p-type silicon wafers to fabricate n-channel MOSFET's.

In accordance with the present invention, a method of forming an adduct of silicon having a small thickness on a silicon substrate is provided. The method comprises directing an ion beam having an energy level below about 150 eV, and preferably about 60 eV, to a silicon substrate at room temperature. The ion beam is a gas preferably formed by ionizing gas of oxygen and/or nitrogen, possibly diluted with argon, in a glow discharge and then extracting the ions through a grid biased negatively with respect to the plasma. This potential serves to accelerate the ions to the desired energy. A second grid placed after the first one can also be used to separate the extraction acceleration/deceleration processes. The presence of the second grid limits the ion flux, but for 60 eV beams this grid can be safely removed. To prevent the positively charged ion beam from diverging because of electrostatic self-repulsion of the ions, electrons may be injected into the beam from a thermionic emitter filament, making the beam net neutral. The electrons do not recombine with the ions during the short flight time to the target, so that the ions are still charged when they strike the silicon.

Ultra-thin FET gate quality oxides on the order of 45-50 angstroms have been produced in accordance with the foregoing process. Silicon nitride thin films have also been formed using this same technique. Investigations indicate that the film thickness is self-limited and largely independent of ion dose, raised substrate temperatures and increased ion energies. It appears that the growth rate quickly decreases once a stoichiometric film is formed. AES and XPS analysis of the produced thin films indicate that the films are not entirely stoichiometric and contain lower oxidation states of silicon. The high electrical quality of the oxide films has brought applications to the fabrication of the N-channel MOSFET's.

Other objects and advantages of the present invention become apparent from the accompanying drawings, detailed description and appended claims.

DETAILED DESCRIPTION OF THE PREFERRED EMBODIMENT

MOS transistors may be fabricated according to the following procedure. p-type (100) silicon wafers, 5 centimeters in diameter, are polished on one side. The wafers should have a bulk resistivity of 5–10 $\Omega$cm. The wafers are chemically cleaned in degreasing agents, $H_2SO_4$, $H_2O_2$ and 10% HF. High-temperature (1050 degrees C.) diffusions of boron and phosphorous form $p^+$ isolation channel and $n^+$ source and drain junctions, from spin-on sources through oxide masks prepared by oxidation in steam at 1,000 degrees C. A 5,000 Angstrom field oxide is grown under the same conditions and gate regions are etched through to the silicon surface using a standard wet buffered oxide etchant (BOE). Immediately before ion beam treatment, the wafers are dipped in a cold dilute HF solution to remove any residual native oxide from the gate regions, and then dried.

Figure 1:
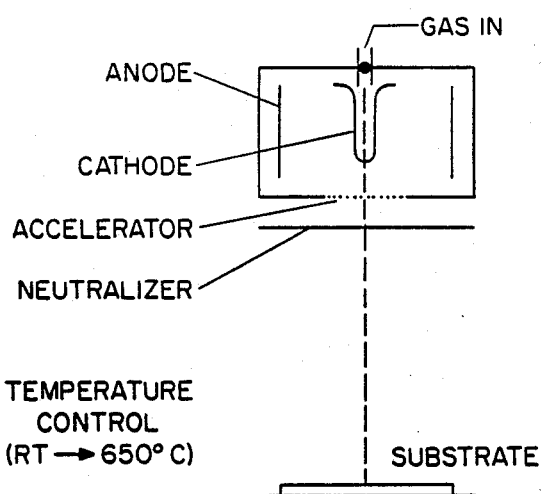
FIG. 1 is a schematic diagram of a low energy ion beam arrangement for practicing the method in accordance with the invention.

Referring to FIG. 1, the gate oxide is grown by bombarding the exposed silicon surface with a composite argon-oxygen ion beam produced by the 2.5 cm beam diameter single-grid Kaufman-type source. Such Kaufman-type source is available from Ion Tech, Inc., Fort Collins CO., and is capable of extracting comparatively large current densities at low applied voltages. The bell jar is evacuated to a base pressure of $3 \times 10^{-7}$ torr Argon and oxygen gases are introduced into the source in the desired ratio, determined by monitoring their flow rates. The working pressure in the vacuum chamber is $3 \times 10^{-4}$ torr and the $O_2$ partial pressure is $6.4 \times 10^{-5}$ torr. The ion beam is extracted through a negatively biased accelerating grid and neutralized by a thermionic filament whose electron emission is adjusted to yield a net neutral beam. The target is positioned on an electrically grounded temperature-controlled copper substrate holder 15 cm from the source.

The ions are created in an $Ar-O_2$ discharge with discharge voltage $V_D=36V$ and discharge current $I_D=0-.6A$. Their energy is determined by the 60V potential at which the entire source is maintained. A total beam current $I_B=58$ mA (maximum current density $J_B=75$ $\mu A/cm^2$) is extracted by an accelerating voltage $V_A=-20V$. The initial oxygen-to-argon flow rate ratio is 1:7 and is increased to 1:1 during the course of the run. The sample is exposed to the beam for 6 minutes. The sample temperature is 28 degrees C. as indicated by a substrate-holder mounted thermocouple. The temperature is observed to rise 5 degrees C. during the exposure.

Figure 2A:
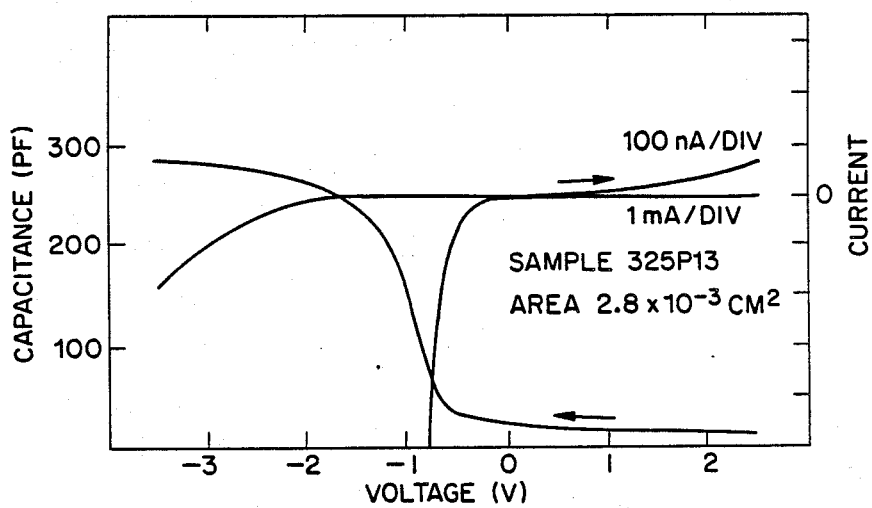
FIGS. 2A and 2B show the capacitance-voltage and current-voltage characteristics of an MOS capacitor fabricated using the process according to the invention with FIG. 2A showing the characteristics as grown, and FIG. 2B showing the characteristics after post-metallization anneal.
Figure 2B:
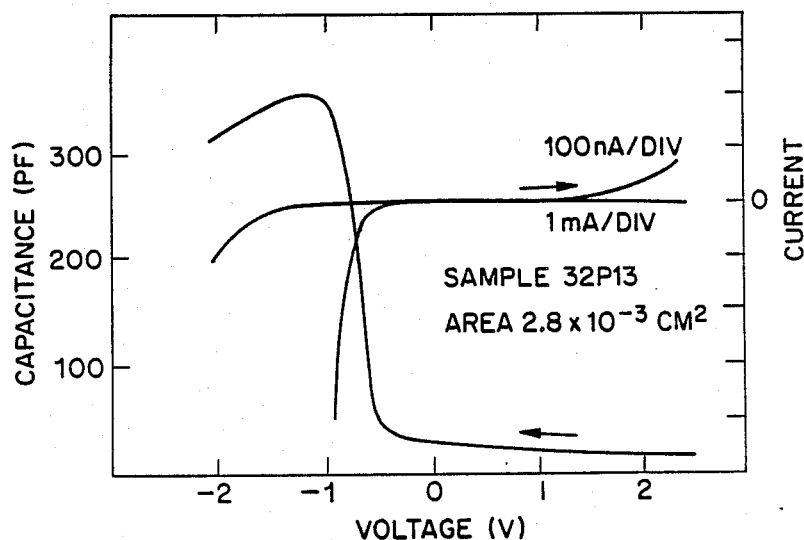

Following ion beam oxidation, source and drain contact windows are opened through the gate oxide and 3000 angstroms of aluminum is thermally evaporated and patterned to form the contact metallization. Another 3000 angstroms of aluminum is evaporated on the backside of the wafer to form a substrate contact and complete the process. Brief post-metallization anneal is carried out at 400 degrees C. in $N_2$ for 3 minutes. The capacitance-voltage (C-V) and current-voltage (I-V) characteristics of a MOS capacitor fabricated by low-energy ion beam oxidation before and after post-metallization annealing are shown respectively in FIGS. 2A and 2B. The flat-band voltage calculated from the accumulation capacitance prior to annealing is $V_{FB}=-0.95V$ and improves to $V_{FB}=-0.6V$ after annealing. This flat-band voltage shift may be due partly to damage caused by the ion bombardment and partly to a not-fully-neutralized ion beam. Although the inversion layer charge begins to leak through the oxide at a relatively low applied voltage, the gate leakage current is at least $2 \times 10^3$ times lower than the source-drain saturation current at the same applied gate voltage, and thus does not degrade MOSFET performance.

The thickness of the produced oxide layer is 45 angstroms as measured by ellipsometry. This agrees with a controlled etch-time measurement in cold BOE and Auger sputter profiling. The index of refraction of ion beam-grown oxides is measured to be higher than that for thermally grown $SiO_2$ films of the same thickness. Also, the oxide capacitance is observed to be lower than that anticipated for a 45 Angstrom oxide. These facts indicate that the film is probably not stoichiometric $SiO_2$ or that the surface of the Si substrate has been damaged by the ion bombardment.

Figure 3A:
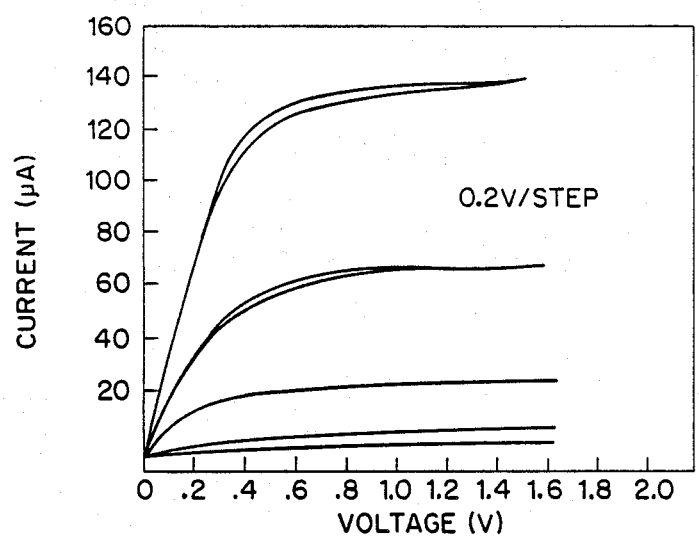
FIGS. 3A and 3B show the current-voltage (C-V) characteristics of a room-temperature n-channel gate-oxide MOSFET, FIG. 3A as grown and FIG. 3B after post-metallization annealing.
Figure 3B:
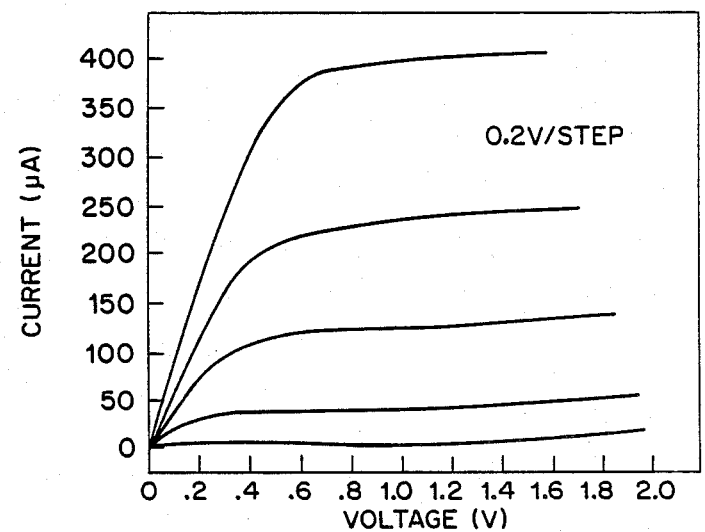

The current-voltage (I-V) characteristics of a room temperature n-channel gate-oxide MOSFET before and after post-metallization annealing as described above (i.e., in $N_2$ for 3 minutes at 400 degrees C.) are shown respectively in FIGS. 3a and 3b. On the basis of the accumulation capacitance, the mobility of the produced MOSFET's prior to annealing is calculated to be 400 $cm^2/V.s$ and is observed to improve after annealing. The threshold voltage is 0.45V and 0.38V before and after annealing, respectively. The breakdown strength of the gate oxide is $7 \times 10^6 V/cm$.

Figure 4:
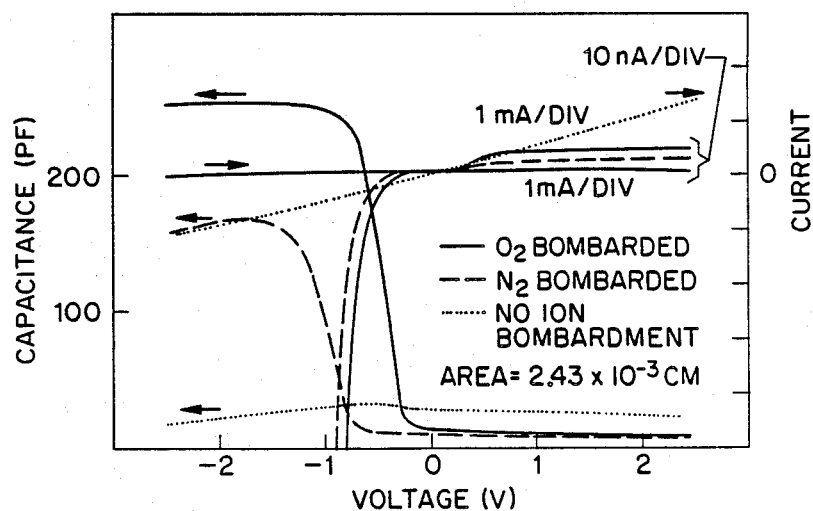
FIG. 4 is a graph showing the C-V and I-V characteristics of low energy ion beam oxide (solid curves), nitride (dashed curves), and control (dotted curves) MIS capacitors.

FIG. 4 presents a comparison of the C-V and I-V characteristics of aluminum gate MIS capacitors fabricated by low energy ion beams at room temperature. The control sample was fabricated by the same procedure except that it was not directly bombarded by the ions, since the shutter was not opened. The ohmic nature of the non-bombarded metal-silicon contact is expected and is evidence that not simply charged, but energetic species are necessary for the formation of the thin films. The figure also indicates that reverse-bias leakage current of the nitride sample is lower than that of the oxide by a factor of two.

To investigate the thickness of the thin films, experiments were also performed on simpler substrates on which only MIS capacitors were fabricated according to the above procedure except no $p^+$ and $n^+$ regions were diffused and no contact holes were etched. These wafers also have large bare regions free of devices used to verify the thickness of the films by ellipsometry measurements.

To ensure that the deposited films are grown by direct ion bombardment and are not due to redeposition of material sputtered from portions of the wafer covered by the field oxide, ion beam oxidation was also carried out on bare silicon wafers cleaned and dipped in HF following the same procedure. The film thickness of these samples was measured on a Gaertner Model L117 ellipsometer immediately after ion beam bombardment and over a period of several days to ensure stability of the deposited films. These samples were also characterized by Auger electron spectroscopy and by XPS in a Leybold-Heraeus LHS-10 surface analysis system equipped with a hemispherical mirror analyzer. The base pressure in the characterization chamber is $4 \times 10^{-10}$ torr. Sputter profiling of the samples is done at $1 \times 10^{-7}$ torr argon.

Figure 5:
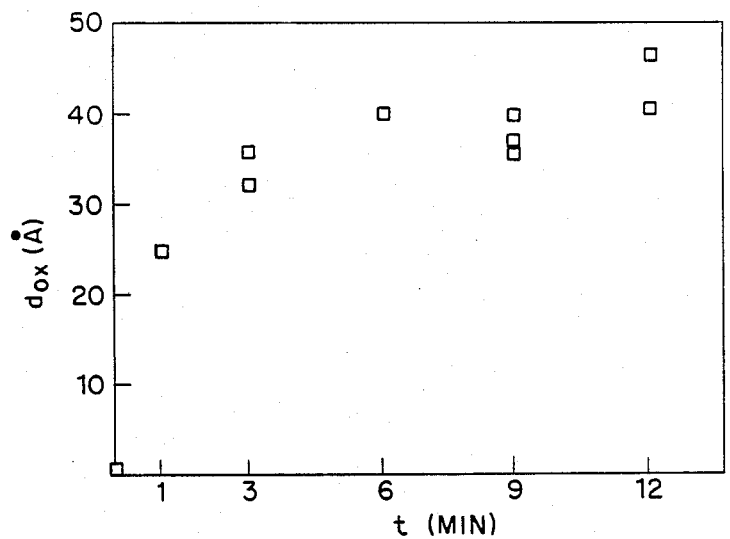
FIG. 5 is a graph showing experimental results of oxide layer thickness $d_{ox}$ (in angstroms) plotted as a function of ion beam exposure time t (in minutes)

The dependence of the film thickness ($d_{ox}$ in angstroms) obtained by ellipsometry on the direction of ion beam treatment (t in minutes) is shown in FIG. 5. Values for the oxide thickness were also obtained from the accumulation capacitance of MIS capacitors measured after post-metallization annealing. The oxide thickness calculated from C-V measurements before annealing is unreliable due to series resistance in the evaporated aluminum-substrate contacts.

The ellipsometry measurements indicate that after a rapid initial growth rate, the oxide thickness increases very slowly with increasing exposure times. This can be explained by the very limited diffusion of oxygen atoms in the silicon at this low temperature and the inability of fresh oxygen arrivals to reach unreacted silicon. It should be noted that the thicknesses obtained from the C-V measurements are all consistently slightly higher than the values obtained by ellipsometry. This is probably due to amorphization of the thin film by the bombarding ions which would lead to the film having a different dielectric constant than that of bulk $SiO_2$ which is assumed in the calculations of the thickness based on C-V measurements.

FIG. 5 is a good illustration of the self-limiting behavior of the obtained thin films. Self-limitation was observed in the measurements of the resistance of thin films grown by direct ion beam oxidation of nickel and for etch depths obtained by reactive sputter etching, where the self-limitation is believed due to the competing effects of deposition and sputtering.

Figure 6:
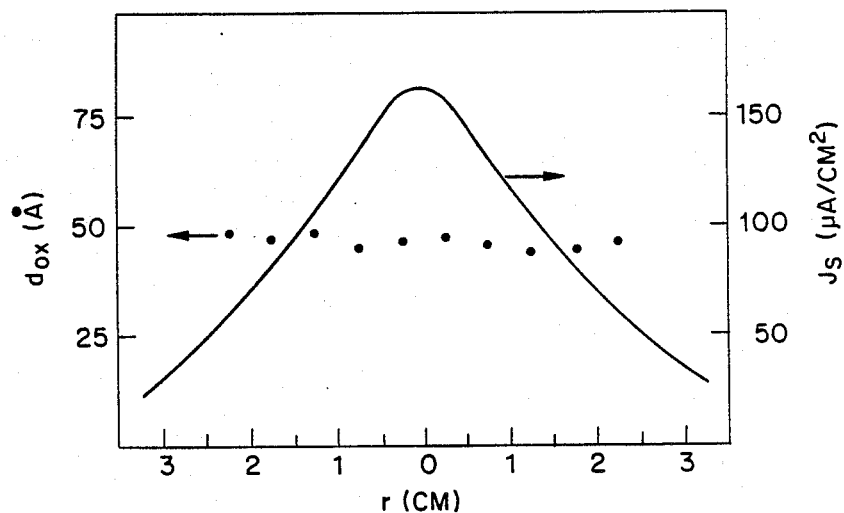
FIG. 6 is a graph showing the oxide film thickness $d_{ox}$ (in angstroms) and the ion beam current density profile $j_B$ (in microamperes per cubic centimeter) plotted against the radius r (in centimeters) from the center of the ion beam.

This dose independence has the useful property of producing very uniform oxide thickness across large targets. The uniformity of the oxides is shown in FIG. 6 where it is plotted against the ion beam intensity profile. The oxide thickness is obtained from the accumulation capacitance of $2.8 \times 10^{-3} cm^2$ MOS capacitors at various wafer sites. The ion beam intensity is measured by a 1.13 cm diameter current probe.

While the preferred embodiment uses an ion beam formed by gas of either oxygen or nitrogen, with or without argon, it is contemplated that an ion beam formed by gas of both oxygen and nitrogen be used, with or without argon. In all cases, an adduct of silicon, such as silicon oxide, silicon dioxide, silicon nitride or silicon oxynitride, will be formed. The current density gas, gas density and pressure and exposure time may be varied as needed or desired to achieve the adduct of silicon.

While a preferred embodiment has been shown and described, numerous variations and modifications will occur to those skilled in the art without departing from the true spirit and scope of the invention. The invention is to be limited only as defined in the appended claims.

We claim:

1. A method for forming an adduct of silicon on a surface of a silicon substrate comprising creating an ion beam having an energy level below about 150 eV, and directing said beam toward said surface of the silicon substrate, said ion beam formed from a gas comprising oxygen or nitrogen.

2. The method according to claim 1 wherein the step of creating an ion beam comprises using a single-grid Kaufman-type ion source.

3. The method according to claim 1 including the step of positioning the silicon substrate about 15 cm from the ion beam source.

4. The method according to claim 1 including the step of mounting the silicon substrate on an electrically grounded metal substrate holder.

5. The method according to claim 1 including neutralizing the charge of the ion beam by introducing electrons into the beam.

6. The method according to claim 2 further including providing a second grid placed after the first grid in the direction of the ion beam to limit the ion flux when the ion beam has an energy level above about 60 eV.

7. The method according to claim 1 further including the step of annealing the substrate at a temperature of about 400 degrees C in $N_2$ gas.

8. The method according to claim 1 wherein the step of creating an ion beam comprises creating an ion beam having an energy level of about 60 eV.

9. The method according to claim 1 further including the step of providing a vacuum chamber, creating the beam and positioning the silicon substrate in the vacuum chamber, evacuating the chamber, and introducing gas into the chamber.

10. A method of making a MOSFET comprising:
   growing an initial wet oxide on a silicon wafer;
   masking the silicon wafer to define pn source and drain junctions;
   growing a field oxide on the wafer;
   etching windows in the field oxide;
   growing a gate oxide by directing an oxygen ion beam having an energy level below about 150 eV towards the silicon wafer at room temperature; and
   opening source and drain contact windows through the gate oxide and depositing a layer of conducting material over the contact windows to form contacts.

11. The method according to claim 10 further including the step of annealing the wafer at a temperature of about 400 degrees C. in $N_2$ gas after the steps of depositing the aluminum layers.

12. The method according to claim 10 wherein the step of growing gate oxide further includes providing a vacuum chamber, positioning the ion beam source and silicon wafer in the chamber, evacuating the chamber, and introducing argon and oxygen gas into the chamber.

13. The method according to claim 10 wherein the step of growing a gate oxide comprises creating an oxygen ion beam using a single-grid Kaufman-type ion source.

14. The method according to claim 10 wherein the step of growing a gate oxide further comprises neutralizing the charge of the ion beam by introducing electrons into the beam.

15. The method according to claim 13 further including providing a second grid placed after the first grid in the direction of the ion beam to limit the ion flux when the ion beam has an energy level above about 60 eV.

16. The method according to claim 10 wherein the step of growing a gate oxide comprises directing an oxygen beam having an energy level of about 60 eV.

17. The method according to claim 10 wherein the step of growing a gate oxide comprises mounting the wafer and an electrically grounded metal substrate holder about 15 cm from the ion beam source.

18. A method of forming an adduct of silicon on a surface of a silcon substrate, comprising creating an ion beam having an energy level below about 150 eV and directing said beam toward said surface of the silicon substrate, said ion beam formed at least partially by oxygen gas.

19. A method of forming an adduct of silicon on a surface of a silicon substrate, comprising creating an ion beam having an energy level below about 150 eV and directing said beam toward said surface of the silicon substrate, said ion beam formed at least partially by nitrogen gas.

* * * * *